United States Patent [19]

McCaldin et al.

[11] Patent Number: 5,646,419
[45] Date of Patent: Jul. 8, 1997

[54] N-TYPE WIDE BANDGAP SEMICONDUCTORS GROWN ON A P-TYPE LAYER TO FORM HOLE INJECTION PN HETEROJUNCTIONS AND METHODS OF FABRICATING THE SAME

[75] Inventors: James O. McCaldin, San Diego; Michael W. C. Wang; Thomas C. McGill, both of Pasadena, all of Calif.

[73] Assignee: California Institute of Technology, Pasadena, Calif.

[21] Appl. No.: 418,274

[22] Filed: Apr. 7, 1995

[51] Int. Cl.$^6$ .............................. H01L 29/06; H01L 33/00
[52] U.S. Cl. .............................. 257/13; 257/17; 257/22; 257/87; 257/90; 257/103
[58] Field of Search .............................. 257/13, 17, 22, 257/76, 87, 89, 90, 96, 101, 103, 200, 201

[56] References Cited

U.S. PATENT DOCUMENTS

| | | | |
|---|---|---|---|
| 3,786,315 | 1/1974 | Mead et al. | 317/234 R |
| 5,223,723 | 6/1993 | Luryi | 257/184 |
| 5,371,409 | 12/1994 | McCaldin et al. | 257/191 |

OTHER PUBLICATIONS

Fundamental Transition in the Electronic Nature of Solids, S. Kurtin et al., *Physical Review Letters*, vol. 22, No. 26, Jun. 30, 1969.

Poly (p-plenylenevinylene) light-emitting diodes: Enhanced electroluminescent efficiency through charge carrier confinement, A.R. Brown et al., *Appl. Phys. Lett.*, 61 (23), Dec. 7, 1992.

3–4 μm laser diodes based on GaInSb/InAs superlattices, R.H. Files et al., presented at "1995 Narrow Gap Semiconductor Conference", 1995.

Use of InN for Ohmic contacts on GaAs/AlGaAs heterojunction bipolar transistors, F. Ren et al., *Appl. Phys. Lett.*, 66 (12), Mar. 20, 1995.

*Primary Examiner*—Minh-Loan Tran
*Attorney, Agent, or Firm*—Blakely, Sokoloff, Taylor & Zafman

[57] ABSTRACT n-type wide bandgap semiconductors grown on a p-type layer to form hole injection pn heterojunctions and methods of fabricating the same. In a preferred embodiment, a p-type gallium nitride substrate is used. A first layer, such as a magnesium zinc sulfide layer $Mg_xZn_{1-x}S$ is then deposited. Thereafter, a second layer such as an n-type zinc sulfide layer is deposited. The magnesium zinc sulfide layer forms an electron blocker layer, and preferably is adequately thick to prevent significant tunneling of electrons there through. Thus, the primary charge flow across the heterojunction is by way of holes injected into the n-type zinc sulfide region from the p-type gallium nitride region, resulting in electron-hole recombination in the zinc sulfide region to provide light emission in the wide bandgap zinc sulfide material. Alternate embodiments are disclosed.

56 Claims, 6 Drawing Sheets

| HOLE EMITTER (p-type region) (Y) | BLOCKER (n-type or intrinsic) (B) | ACTIVE REGION (n-type region) (A) |
|---|---|---|
| | (alloy of X) ------------ (X) <br> (X) ------------ (alloy of X) <br> (alloy$_1$ of X) -------- (alloy$_2$ of X) | |
| p-GaN | $E_c(B) > E_c(A)$ | $E_v(A) > E_v(p-GaN)$ <br><br> preferably sulfides selinides |

FIG. 5

| hole emitter | $E_c(B) > E_c(A)$ | $E_v(A) \geq E_v(Y)$ |
|---|---|---|

FIG. 6

| hole emitter | $E_c(B) > E_c(A)$ | $E_v(X) \geq E_v(Y) - \Delta$ |
|---|---|---|

FIG. 7

| hole emitter | $E_c(B) > E_c(A)$ | $E_v(A) \geq E_v(Y) - \Delta$ <br> plus quantum well |
|---|---|---|

FIG. 8

N-TYPE WIDE BANDGAP SEMICONDUCTORS GROWN ON A P-TYPE LAYER TO FORM HOLE INJECTION PN HETEROJUNCTIONS AND METHODS OF FABRICATING THE SAME

STATEMENT OF GOVERNMENT INTEREST

The U.S. Government has certain rights in this invention pursuant to Grant No. N00014-92-J-1845 awarded by the U.S. Navy.

BACKGROUND OF THE INVENTION

1. Field of the Invention

The present invention relates to semiconductor light emitters such as diodes and lasers, and to methods of manufacturing the same.

2. Prior Art

Semiconductor light emitters are well-known and fall broadly into two categories: light emitting diodes (LEDs) and semiconductor lasers. The applications of these devices are numerous. LEDs are used extensively as displays, warning lights and indicating lights. Semiconductor lasers find wide application in communications, such as for transmitting signals down optical fibers, writing information on compact discs and for use in projection televisions. While LEDs and semiconductor lasers are both light emitters, in many applications the two different devices are not interchangeable. Light emitting diodes are the devices of choice for many display applications. The low operating current, low power consumption, dispersal of light, and typical low cost of manufacturing are all advantages that light emitting diodes have over lasers for displays. They exhibit very long lives and maintain high efficiency and thus, have begun to replace many incandescent lamps in a number of applications. Semiconductor lasers, on the other hand, find wide application where coherent beams of light are required as described above.

While versatile and wide in their application, LEDs and semiconductor lasers have historically suffered one serious deficiency; the wide variety of selection among them has been severely limited in the green or blue wavelengths. While yellow and red semiconductor light emitters are popular and well-developed, blue and green light emitters have been more elusive. Blue and green light emitters lend themselves to numerous applications. They can provide for advanced displays in the blue and green, where the human eye is most sensitive. They can provide the third primary color, the other two being red and yellow, whereby any color can be generated by combining those primaries in particular combinations. Also, because sea water shows the lowest absorption in the blue and green wavelengths, a blue or green semiconductor laser would provide an underwater optical communication means not currently available. In the recording industry, the density of information that may be recorded on an optical disc is currently limited by the wavelengths of the laser. These densities can be greatly increased, by a full order of magnitude, with the use of a compact blue light emitter.

More recently, a blue light emitter has been introduced by a company in Japan by the name of Nichia. These emitters are fabricated in gallium nitride and gallium nitride alloys doped n and p to form the pn junction. The gallium nitride forms a very efficient emitter, and is very tolerant of defects in the structure, even tolerant of cracks therein.

The mechanisms by which semiconductors emit light have been well-studied and are fairly well understood. LEDs and semiconductor lasers emit light as a result of electronic excitation of a material. An electron in an excited energy state, upon relaxing to a lower energy state, can emit a photon corresponding to the energy difference between the excited state and the lower energy state. The methods of exciting electrons vary, but for semiconductor light emitters the primary method is by injection electroluminescence. Energy is added to the system to coax electrons to a higher energy state. The energy states of concern in semiconductor light emitters can be characterized as the conduction band and the valence band.

Semiconductors are of three types, p-type, n-type and intrinsic. Intrinsic semiconductors can be made either p-type or n-type by introducing impurities, also called dopants of p-type or n-type, respectively. Semiconductor light emitting devices are essentially characterized by p-type material and n-type material having a pn-junction there between. Light emitting semiconductor devices have a recombination region between or within the p-type and n-type regions. At equilibrium, no light will be emitted by the device. However, if electrons from the n-type material can be coaxed into the conduction band over the holes of the p-type material, a situation arises where the electrons are excited. This coaxing is carried out by applying a forward bias across the junction. Electrons, once excited, after a period of time will relax from their excited energy level either spontaneously or by stimulation. This relaxation from the conduction band to the valence band often results in the emission of a photon.

The wavelength of an emitted photon will depend primarily on the energy difference between the conduction band and the valence band of the material or materials in which the recombination occurs. This energy difference is referred to as the band gap of the material. The energy difference of the band gap $E_g$ is inversely related to the wavelength $\lambda$ of the emitted light by the well-known formula $E_g = hc/\lambda$, where h is Planck's constant and c is the speed of light. Blue and green light is light of shorter wavelengths than red or yellow light. Therefore, to emit blue or green light requires a greater energy difference between the conduction band and valence band of the materials used. Red and yellow light emission results from a band gap in the range of 1.77 to 2.16 eV. Green and blue emission requires a band gap in the range of about 2.2 to 2.9 eV, and beyond for emission that goes into the violet. Sometimes the emitted light is slightly less energetic than the value $E_g$, because carriers transition between shallow energy levels near the band edges.

Thus, to use direct emission of light as an approach to blue/green semiconductor light emitting devices, one has to obtain a band gap that exhibits the appropriate energy difference. Further, one has to be able to construct electronic devices with both n-type and p-type regions and to make appropriate electrical contact for easy conversion of current to emitted photons. A quick survey of the periodic table in the semiconductor region indicates that three primary groups of semiconductors are potentially useful for this application: the so-called III–V semiconductors in which the compound is made of an element from column III and an element from column V, the II–VI compounds in which the compound is made up of an element from column II and an element from column VI, and the compounds from the elements of column IVa of the periodic table.

For the III–V semiconductors, those with relevant band gaps for the blue and green involve either GaP in the green or GaN in the ultraviolet. GaP, while it can be doped both p-type and n-type, suffers the problem that it has an indirect band gap. An indirect band gap makes it difficult to produce high efficiency light emitting devices because the assistance of a phonon is necessary to carry out the required electron transitions. To avoid this difficulty, manufacturers utilizing such materials have had to resort to quaternary alloys of AlGaInP to obtain direct transitions and this fix is only good to 2.30 eV in the green. Furthermore, compositions in quaternary systems are very difficult to control. On the other hand, compounds of GaN are extremely difficult to dope p-type and hence, there has been great difficulty in making pn-junction light emitting devices from them.

Examination of the properties of the II–VI compounds indicates that the materials with the appropriate band gaps for emission in the green and blue are ZnTe, ZnSe, ZnS and CdS, though. CdS incurs the problems of ZnS without offering a large band gap like ZnS. All of these compounds are direct band gap materials and hence, suitable for making light emitters. Again, it has been difficult to obtain doping of the required levels in these systems for making light emitting pn-junctions. Notably, ZnTe can be doped p-type but it is extremely difficult to dope n-type. ZnSe has been historically easily doped n-type but difficult to dope p-type, and the sulfides have been relatively easily doped n-type but difficult to dope p-type.

Semiconductors produced by elements from group IV are limited. The only material of practical interest is SiC. Some crystal forms of this substance have band gaps that put them in the blue and can be doped to p- and n-type. However, difficulties controlling crystal quality have resulted in only low efficiency light emitters. Another basic problem with the use of SiC is that the electron transitions are indirect.

Recent attempts at producing blue and green light emitters have focused heavily on two areas. One is the bulk doping of p-ZnSe. Although blue light emission lasers have been reported, the problems inherent in bulk doping are significant. Another approach has been the utilization of heterojunctions, particularly ZnTe/ZnSe. This heterojunction configuration suffers from a large lattice mismatch of 7%, and neither material can be doped both types. In general, type-II heterojunctions have not heretofore been useful in the fabrication of light emitters and lasers.

Accordingly, there is room for advancement in the quest for blue and green semiconductor light emitting devices. Of particular interest is the possibility of developing blue semiconductor light emitting devices which can be fabricated on a large area substrate using processing techniques that could also be used to fabricate other color semiconductor light emitting devices, such as red and green semiconductor light emitting devices, on the same substrate. This would allow production of high resolution, full color solid state integrated circuit display panels of particularly high quality and reliability.

SUMMARY OF THE INVENTION n-type wide bandgap semiconductors grown on a p-type layer to form hole injection pn heterojunctions and methods of fabricating the same. In a preferred embodiment, a p-type gallium nitride substrate is used. A first layer such as a magnesium zinc sulfide layer $Mg_xZn_{1-x}S$ is then deposited. Thereafter, a second layer such as an n-type zinc sulfide layer is deposited. The magnesium zinc sulfide layer forms an electron blocker layer, and preferably is adequately thick to prevent significant tunneling of electrons there through. Thus, the primary charge flow across the heterojunction is by way of holes injected into the n-type zinc sulfide region from the p-type gallium nitride region, resulting in electron-hole recombination in the zinc sulfide region to provide light emission in the wide bandgap zinc sulfide material. Alternate embodiments are disclosed.

Selection of processing and materials, and particularly alloying materials and/or dopants for individual regions of the n-type layer offer the possibility of providing full color light-emitting diode, flat panel displays.

BRIEF DESCRIPTION OF THE DRAWINGS

FIG. 5 is a diagram illustrating one form of the conduction and valence band requirements for the materials of the heterojunction emitters of the present invention when using p-type gallium nitride for the hole emitter.

FIG. 6 is a diagram illustrating one form of the conduction and valence band requirements for the materials of the heterojunction emitters of the present invention when not necessarily using p-type gallium nitride for the hole emitter.

FIG. 7 is a diagram illustrating another, more relaxed form of the conduction and valence band requirements for the materials of the heterojunction emitters of the present invention when not necessarily using p-type gallium nitride for the hole emitter.

FIG. 8 is a diagram illustrating one form of the conduction and valence band requirements for the materials of the heterojunction emitters of the present invention further including an alloy material such as cadmium to form a quantum well for operation of the light emitter as a laser.

DETAILED DESCRIPTION OF THE INVENTION

The present invention comprises n-type wide bandgap semiconductors grown on a p-type layer such as a nitride to form hole injection pn heterojunctions and methods of fabricating the same. In accordance with a preferred method of fabricating such junctions, a p-type gallium nitride substrate is used, over which an electron blocker layer is deposited, followed by the deposition of an n-type layer such as a zinc sulfide layer to complete the pn junction. The electron blocker layer provides an energy barrier, preventing injection of electrons from the n-type layer into the barrier layer and from there into the p-type substrate. Holes from the p-type substrate, however, may be injected through the electron blocker layer to the n-type layer, with the net result being the recombination of holes and the electrons in the wide bandgap n-type region, resulting in the emission of relatively short wavelength light.

In order to describe the present invention, first a preferred embodiment thereof will be disclosed. Thereafter, the general characteristics and requirements of the invention will be described, with various alternate embodiments also being disclosed.

Figure 1:
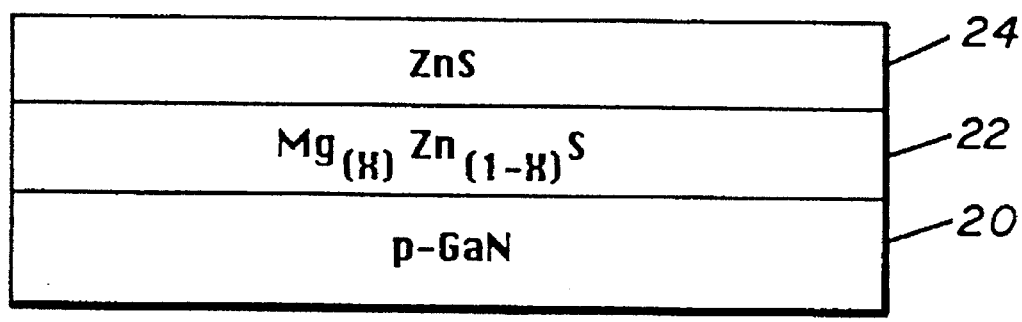
FIG. 1 is a diagram, not to scale, illustrating a preferred embodiment of the present invention.

Accordingly, first referring to FIG. 1, the structure of a preferred embodiment of the present invention may be seen. As shown therein, a p-type gallium nitride layer 20 is provided as a substrate or layer on a substrate. Thereafter, a magnesium zinc sulfide ($Mg_xZn_{1-x}S$) layer 22 is deposited over the p-type gallium nitride layer, over which is then deposited a zinc sulfide layer 24. The magnesium zinc sulfide layer 22 is preferably on the order of 100 to 200 Angstroms thick. More specifically, the layer 22 is deposited in a thickness adequate to prevent substantial tunneling of electrons there through. As shall subsequently be seen, the effect of the magnesium zinc sulfide layer is to shift the conduction band upward in the region between the p-type gallium nitride layer and the n-type zinc sulfide layer, thereby forming a barrier to the flow of electrons from the n-type zinc sulfide region 24 to the p-type gallium nitride region 20. This has the effect of preventing the flow of electrons from the n-type zinc sulfide region 24 through the electron blocker layer 22 to the p-type gallium nitride layer 20. On the other hand, holes originating in the p-type gallium nitride region are free to be injected into the magnesium zinc sulfide region 22, and from there into the n-type zinc sulfide layer to recombine in the n-type zinc sulfide layer adjacent to the electron blocker layer 22. In general, recombination does not occur in the electron blocker region for the reason that the same is essentially free of electrons in the conduction band, with much of the recombination occurring in the n-type zinc sulfide layer away from the interface between the electron blocker and the zinc sulfide layer. This is an important aspect of the present invention, as the lattice mismatch of the different materials at the junction results in many traps or defects at the junction which will cause recombination of electrons and holes in an energy dissipating, non-light radiative manner. Also the different materials on each side of the heterojunction can result in mixing of the component elements of the heterojunction materials, forming still different compounds at the junction in which recombination can occur without light emission. Accordingly, the introduction of the electron blocker in the preferred embodiment prevents recombination at the junction in favor of recombination in the wide bandgap n-type zinc sulfide layer, primarily in a region adequately displaced from the junction to provide a relatively efficient light-emitting capability.

Figure 2:
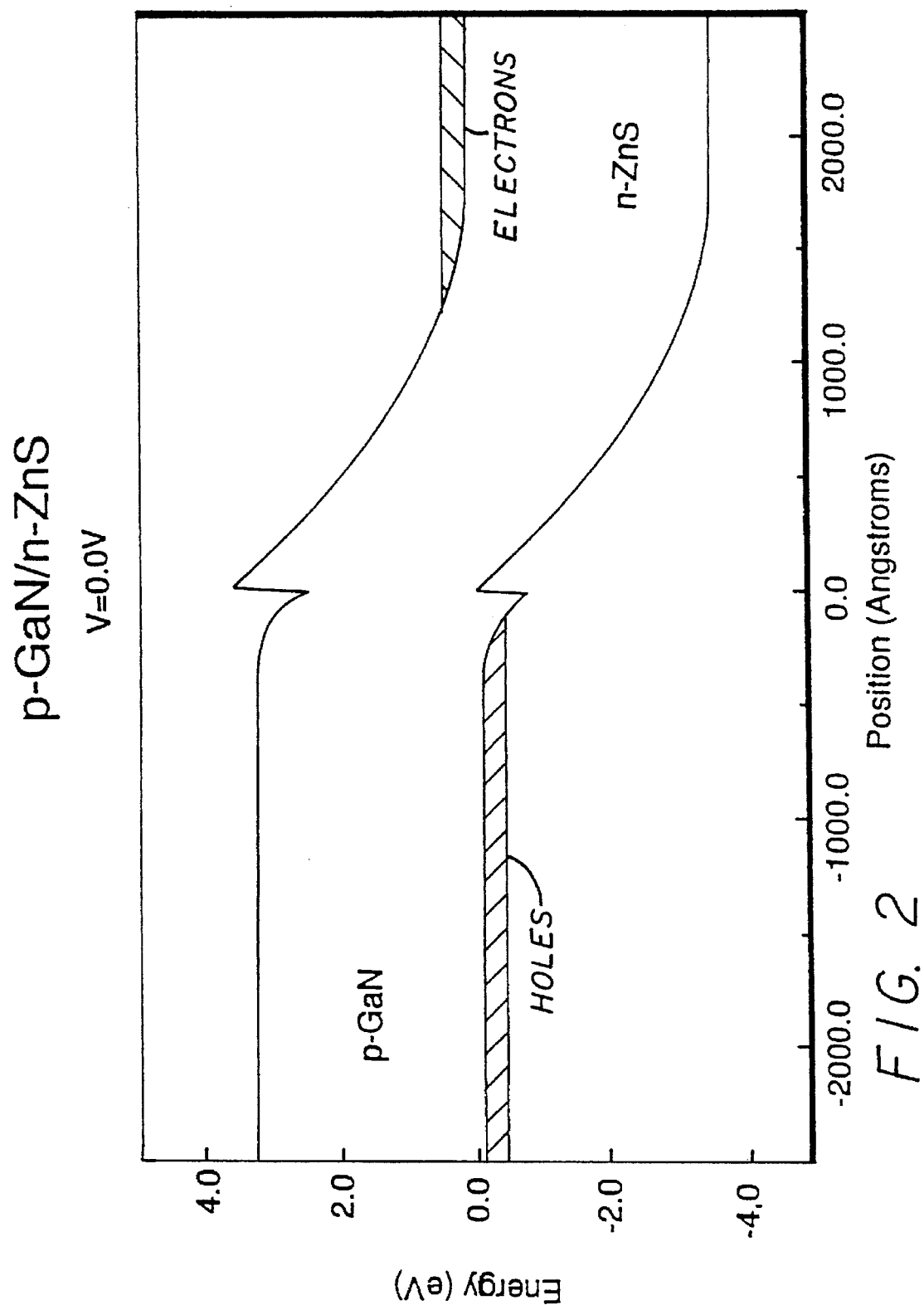
FIG. 2 is a diagram illustrating the conduction and valence bands in the region of the junction of a p-type gallium nitride/n-type zinc sulfide heterojunction with no bias voltage thereon.
Figure 3:
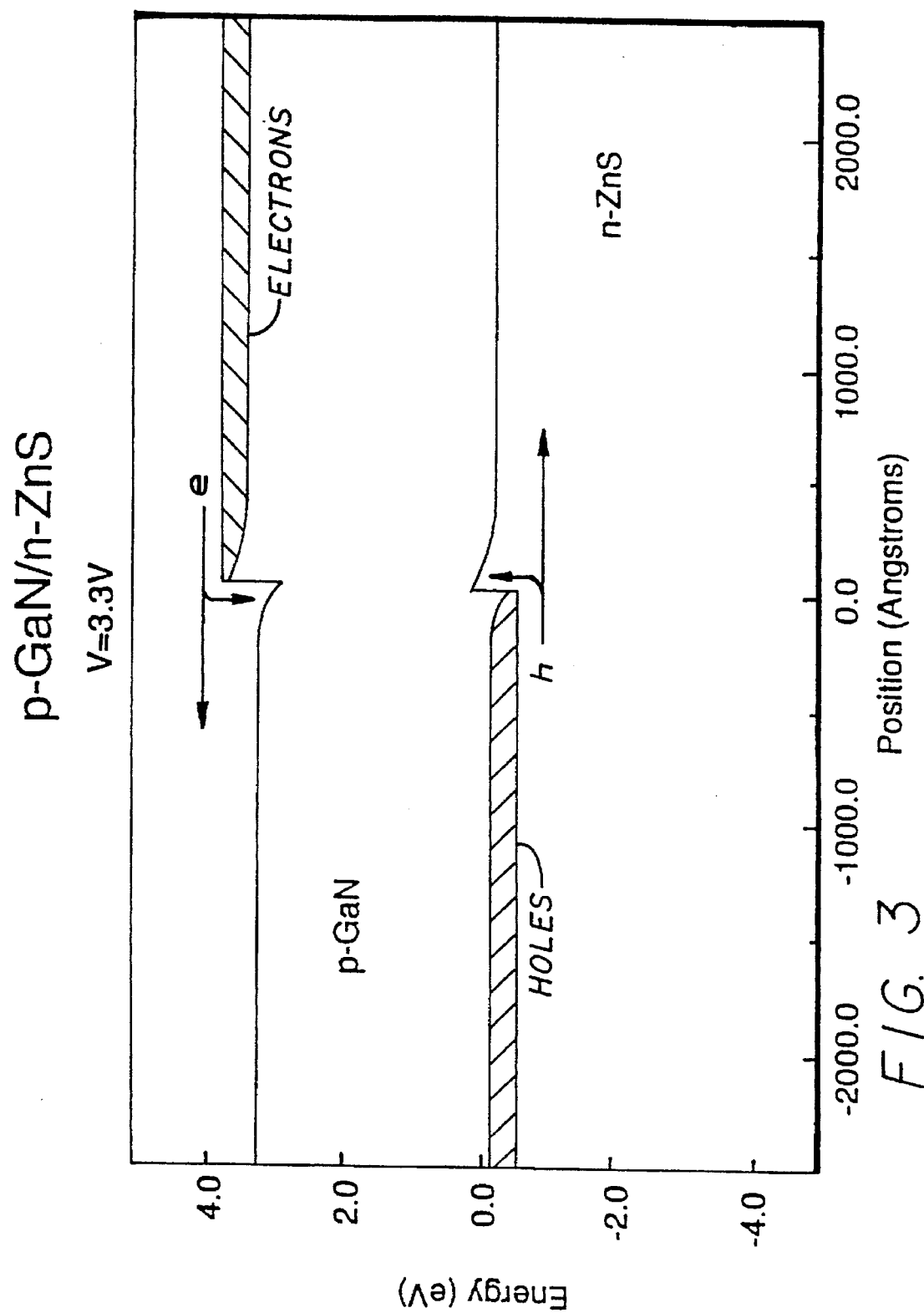
FIG. 3 is a diagram of the conduction and valence bands in the region of the junction of the p-type gallium nitride/n-type zinc sulfide heterojunction of FIG. 1 with a forward conduction bias voltage of approximately 3.3 volts thereon.

The foregoing may be illustrated by first considering a simple p-type gallium nitride/n-type zinc sulfide heterojunction as illustrated in the energy diagrams of FIGS. 2 and 3. FIG. 2 is an energy diagram showing the conduction bands and valence bands for the p-type gallium nitride and the n-type zinc sulfide, including the bending of the bands in the region of the heterojunction there between for zero bias voltage between the two regions. In this and the following FIGS., the zero level is taken as the Fermi level of the hole emitters. It may be seen that holes in the valence band of the p-type gallium nitride region do not have sufficient energy to pass under the downward bend of a valence band in the p-type gallium nitride region to be injected into the n-type zinc sulfide region. Similarly, the electrons trapped in the conduction band in the n-type zinc sulfide region do not have sufficient energy to pass over the upper bending portion of the conduction band of the n-type zinc sulfide region to pass into the p-type gallium nitride region. Accordingly, the holes and electrons do not coexist in any portion of either region so as to enable recombination in that region.

FIG. 3 illustrates the energy levels of the conduction band and valence band in the region of the heterojunction when the same is forward biased, say by approximately 3.3 volts. Here, the band bending is reduced to the extent that electrons can spill over the energy barrier caused by the band bending, to be injected from the n-type zinc sulfide region through the junction into the p-type gallium nitride region. Similarly, the holes in the p-type gallium nitride region have sufficient energy to extend through the junction and spill over into the n-type zinc sulfide region. Because now the electrons and the holes coexist in the same region, the same will relatively rapidly recombine, potentially emitting a photon. The problem, however, is that the greatest recombination rate will occur at or very close to the junction itself. Because the lattice mismatch is substantial and the different elements present at the junction may form still other compounds, the density of lattice defects is very high and unwanted compounds may exist in this region, resulting in a relatively high percentage of hole-electron recombinations which do not emit light.

Figure 4:
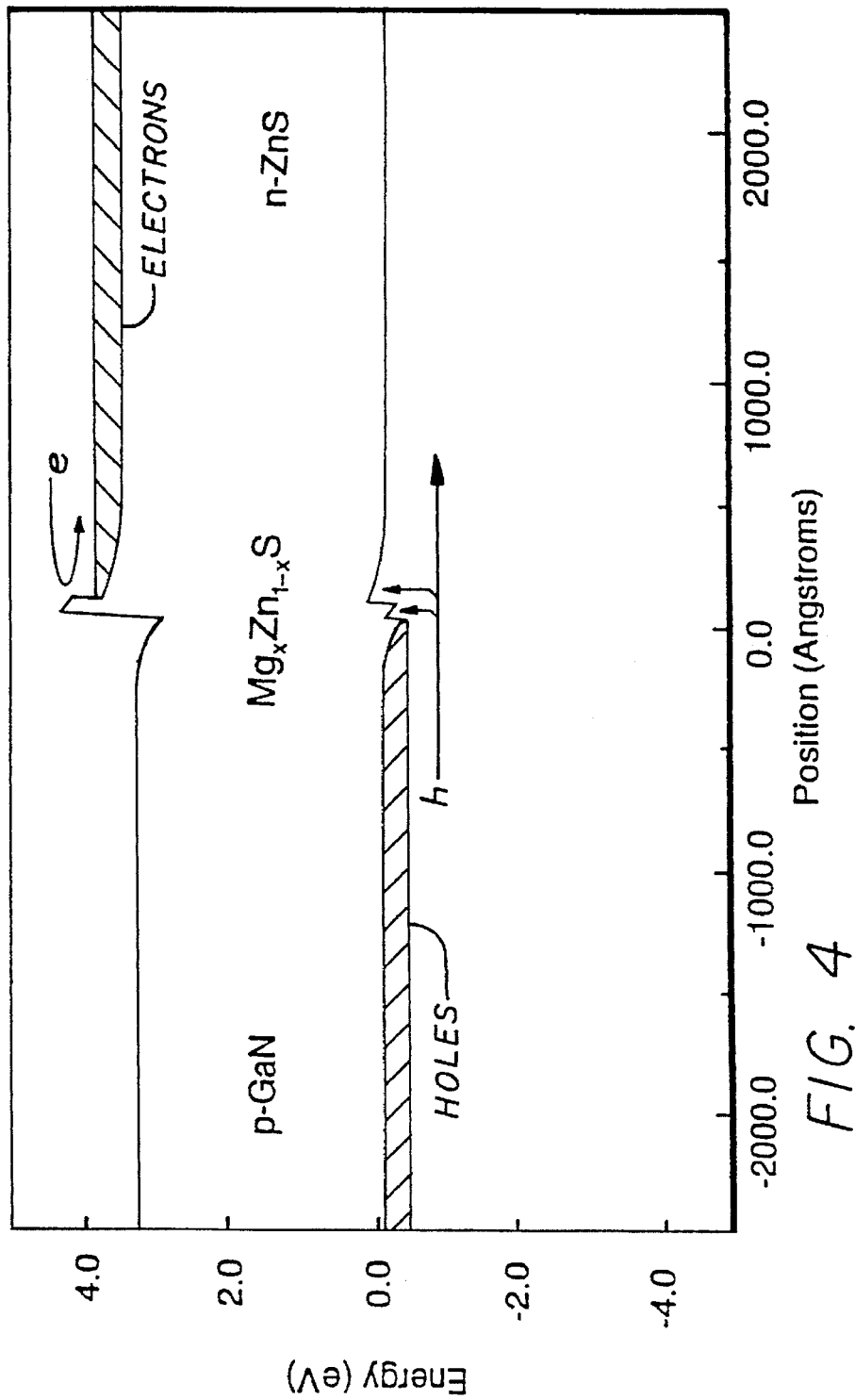
FIG. 4 is a diagram similar to FIG. 2 showing the conduction and valence bands in the region of the junction of the p-type gallium nitride/n-type zinc sulfide heterojunction having a magnesium zinc sulfide electron blocker layer there between and with a forward conduction bias voltage of approximately 3.3 volts thereon.

In accordance with the preferred embodiment, the interposition of a barrier layer such as a magnesium zinc sulfide electron barrier layer, when similarly biased as in FIG. 3, creates an energy diagram as shown in FIG. 4. Here, the magnesium zinc sulfide layer pushes up the conduction band in comparison to the otherwise expected upward bending of the n-type zinc sulfide adjacent to the junction. Also the magnesium zinc sulfide layer introduces a notch in the valence band of FIG. 4 that is not present in FIG. 3. The blocking effect of this notch on hole transport from the nitride to the sulfide, however, is of limited extent. Furthermore, this notch can be rounded by grading the magnesium concentration from its initial high concentration at the junction towards the lower concentration, if any, in the active region. In particular, with the approximately 3.3 volt bias of the FIG., holes trapped in the valence band of the p-type gallium nitride layer are injected under the valence band of the magnesium zinc sulfide barrier region and into the n-type zinc sulfide region. Electrons trapped in the conduction band of the n-type zinc sulfide region, however, do not have adequate energy to pass over the conduction band barrier of the magnesium zinc sulfide layer and, accordingly, are forced to remain in the n-type zinc sulfide region. Similarly, of course, the electrons cannot tunnel through the magnesium zinc sulfide, as the same is purposely given an adequate thickness to prevent tunneling of electrons through the barrier layer in any meaningful quantity. Thus, an active region is established within the n-type zinc sulfide region within which recombination occurs, emitting light of the desired relatively short wavelength because of the relatively large bandgap of the n-type zinc sulfide, namely, 3.62 electron volts.

To obtain the p-type gallium nitride in the preferred embodiment, a magnesium dopant is preferred, having a concentration of approximately $10^{19}$ $cm^{-3}$ or greater. The zinc sulfide is made n-type with chlorine or aluminum to give an electron concentration of approximately $10^{17}$ $cm^{-3}$. In general, it is preferred to have the p-type hole emitter region relatively heavily doped and the n-type active region relatively lightly doped, the difference being on the order of one to three orders of magnitude.

Having now described the structure and operation of the preferred embodiment of the present invention, a more general description of the invention will be presented. As illustrated in FIG. 5, the present invention utilizes a hole emitter region, which of course is a p-type region Y, more preferably a p-type gallium nitride region. The active region, which may also be referred to as the recombination region or two carrier region, is of course an n-type region comprised of an n-type material X or an alloy thereof characterized by a valence band energy which equals or exceeds the valence band energy of the p-type gallium nitride region. The blocker region, an n-type region or alternatively an intrinsic region, is preferably an alloy of the material of the active region X, or a material of the alloy of the active region, or a different alloy of the active region alloy, or a graded alloy. Alloys are used in this manner to provide an improved lattice match at the electron blocker-active region interface, and to avoid introduction of still additional elements which may form different, unwanted compounds at the interface between the blocker region and the active region, reducing the efficiency of the light emission. To function as the desired electron blocker, the conduction band of the electron blocker region must be higher than the conduction band of the active region itself. Suitable materials for the active region include most sulfides such as zinc sulfide, as in the preferred embodiment, and further at least include some selenides. Of course, as before, the bandgap of the active region in which the recombination occurs must be adequate to provide light emission at the desired wavelength.

As may be seen in FIG. 6, the p-type hole emitter region is not necessarily limited to p-type gallium nitride, though the same is preferred, provided the combination of the p-type hole emitter region and the n-type active region satisfy the requirement that the valence band energy of the active region equals or exceeds the valence band energy of the hole emitter region. Other potential materials which could be used for the hole emitter region include, but may not be limited to, some nitrides other than gallium nitride.

Referring now to FIG. 7, it is believed that the requirement herein before described with respect to the valence band energy of the active region exceeding the valence band energy of the hole emitter region is not a strict requirement, provided it is at least adequately approximated. Accordingly, as can be seen in FIG. 7, this requirement is indicated as being reduced by an amount $\Delta$, whereby an n-type material of an appropriate bandgap and a valence band energy at least closely approaching the valence band energy of the p-type hole emitter region are potential candidates for use in the present invention. It is believed that the valence band energy of the n-type active region should as a minimum at least approach the valence band energy of the p-type hole emitter region by a $\Delta$ of approximately 0.3 electron volts, or perhaps as close as approximately 0.2 electron volts. In this event the injection of the holes is primarily thermionic. Accordingly another way of specifying $\Delta$ is to limit the same to approximately 10 kT, where k is the Boltzmann constant and T is the absolute temperature. Such borderline cases would include the use of p-GaN and n-ZnO in the heterojunction devices of the present invention.

Figure 9:
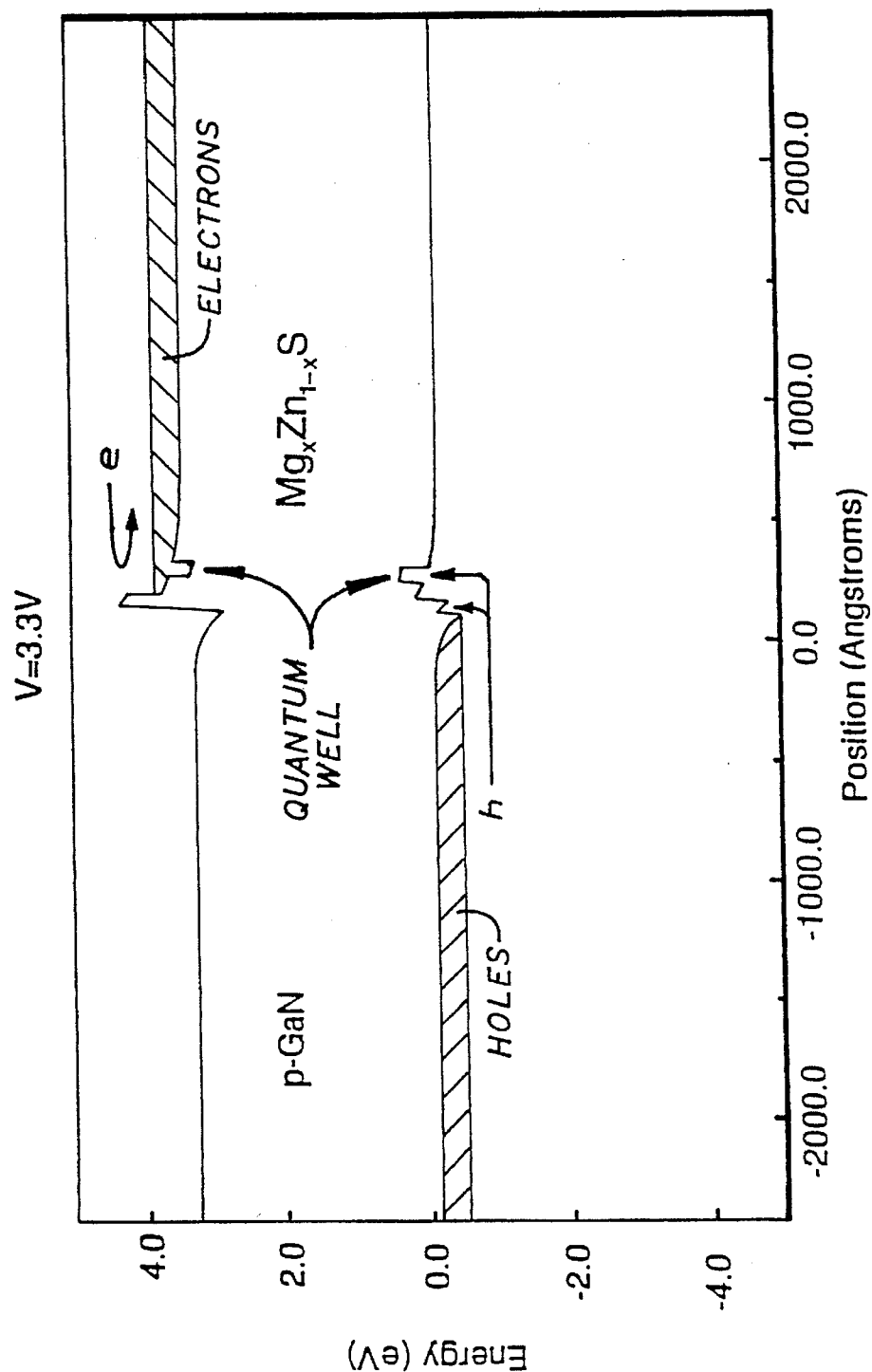
FIG. 9 illustrates an embodiment of the present invention wherein the electron blocker, the active region and the quantum well all consist of magnesium zinc sulfide layers $Mg_xZn_{1-x}S$, the quantum well being the region most lightly alloyed with magnesium, the regions surrounding the quantum well being somewhat more heavily alloyed with magnesium, and the electron blocker region being the most heavily alloyed region with magnesium.

Finally, with respect to FIG. 8, the n-type active region may include a material such as cadmium forming a quantum well, making the device of the present invention a laser diode. In that regard, it should be noted that the reference to the zinc sulfide active region or layer herein and in the claims that follow does not necessarily refer to a pure zinc sulfide region. By way of example, the zinc sulfide active region may be a magnesium zinc sulfide layer $Mg_xZn_{1-x}S$ wherein x is significantly less than for the electron blocker region. By way of further example, FIG. 9 illustrates an embodiment wherein the electron blocker, the active region and the quantum well all consist of magnesium zinc sulfide layers $Mg_xZn_{1-x}S$. The quantum well from which recombination occurs is the region most lightly alloyed with magnesium (x is smallest). The "active region" is somewhat more heavily alloyed with magnesium (x somewhat larger), and the electron blocker region is the most heavily alloyed region (x is largest of the three regions).

It was previously stated that the blocker region is preferably an alloy of the material of the active region X, or a material of the alloy of the active region, or the alloy of the active region alloy, but of different alloying ratios. FIG. 1 is an illustration of an embodiment wherein the blocker region is an alloy of the material of the active region X. Another possible example of such an embodiment would be to use manganese zinc sulfide to push up the conduction band in comparison to the otherwise expected upward bending of the n-type zinc sulfide adjacent to the junction, though it is not clear that the extent of increase of the conduction band in such a blocker region would be adequate for best performance. The embodiment described with respect to FIG. 9 is an example of an embodiment wherein the blocker region and the active region are alloys of the same elements, but of differing alloying ratios. Of course FIG. 9 includes a still further alloy of the same elements to provide a quantum well, though in that example, the quantum well itself could simply have been zinc sulfide, or could be eliminated entirely to form a light emitting diode. An example of an embodiment wherein the blocker region is a material of the alloy of the active region comprises a blocker region of zinc sulfide (ZnS) and an active region of zinc cadmium sulfide ($Zn_xCd_{1-x}S$).

In a broad sense, tetrahedrally coordinated materials having a sufficiently high bandgap so as to be of potential interest include ZnS, AlN, $Ga_2O_3$ and ZnO. Other materials of possible interest also having a sufficiently high bandgap include GaS, $SiO_2$ and $SnO_2$. In general, the materials of interest to the present invention are compounds formed primarily by more ionic bonding than covalent bonding. (See *Fundamental Transition in the Electronic Nature of Solids,* S. Kurtin, T. C. McGill and C. A. Mead, *Physical Review Letters,* Vol. 22, No. 26, Jun. 30, 1969) Ionic bonding results when the electronegativity of the anion differs greatly from the electronegativity of the cation. Also in general, the light-emitters of the present invention are mostly type-II heterojunctions. In that regard, in a type-I structure, the valence band and conduction band of the material on one side of the junction are higher and lower, respectively, than the valence band and conduction band of the material on the other side of the junction. In a type-II heterojunction, the valence band and conduction band on one side of the junction are both higher or lower than the respective bands on the other side. Finally, since the light emission occurs in the active region, the same needs to be at least somewhat transparent to the wavelength of the light emitted. Most materials having a wide enough band gap for this purpose satisfy this requirement. Also the p-type gallium nitride is also transparent, and since the emission is near the junction, the emission can be viewed through the GaN side of the device.

Use of silver as the dopant in the zinc sulfide active region would provide a blue emission in the device of the present invention. Other dopants could be used to obtain the other two primary colors. Alternatively, the presence of cadmium in place of the zinc in the zinc sulfide layer is known to increase the wavelength of the emission, and accordingly cadmium could also be selectively substituted in differing amounts for the zinc in zinc sulfide n-type active regions to control the color emitted thereby, as previously described. Thus the processing and selection of materials, and particularly dopants and/or alloying materials, for individual regions of the n-type layer offer the possibility of providing full color light-emitting diode, flat panel displays. Thus, while the present invention has been disclosed and described with respect to certain preferred embodiments thereof, it will be understood to those skilled in the art that the apparatus and methods of the present invention may be varied without departing from the spirit and scope of the invention.

What is claimed is:

1. A wide bandgap semiconductor light emitter comprising:
   a two terminal device having:
   a p-type layer having conduction and valence band energies;
   an electron blocker layer deposited on the p-type layer to form a heterojunction and having conduction and valence band energies;
   an n-type active layer deposited on the electron blocker layer and having conduction and valence band energies;
   the conduction band energy of the active layer being greater than the conduction band energy of the p-type layer;
   the valence band energy of the active layer being at least approximately equal to the valence band energy of the p-type layer;
   the conduction band energy of the electron blocker layer being greater than the conduction band energy of the active layer;
   the electron blocker layer having a thickness adequate to prevent significant electron tunneling through the electron blocker layer;
   the active layer and the electron blocker layer each being selected from the group consisting of a specific material and an alloy of the specific material;
   the wide bandgap semiconductor light emitter emitting light by the application of a forward bias voltage between the p-type layer and the active layer causing the injection of holes from the p-type layer into the active layer.

2. The wide bandgap semiconductor light emitter of claim 1 wherein the active layer and the electron blocker layer are alloys of the same elements, but with differing alloying ratios.

3. The wide bandgap semiconductor light emitter of claim 1 wherein the active layer is an alloy of the electron blocker layer.

4. The wide bandgap semiconductor light emitter of claim 1 wherein the electron blocker layer is an alloy of the active layer.

5. The wide bandgap semiconductor light emitter of claim 1 wherein the p-type layer comprises a nitride layer.

6. The wide bandgap semiconductor light emitter of claim 1 wherein the active layer is a sulfide layer.

7. The wide bandgap semiconductor light emitter of claim 1 wherein the active layer is a selenide.

8. The wide bandgap semiconductor light emitter of claim 1 wherein the active layer includes a quantum well.

9. The wide bandgap semiconductor light emitter of claim 8 wherein the quantum well is formed by the presence of cadmium in the active layer.

10. The wide bandgap semiconductor light emitter of claim 8 wherein the electron blocker, the active layer and the quantum well all consist of magnesium zinc sulfide layers $Mg_xZn_{1-x}S$, the quantum well being the layer most lightly alloyed with magnesium, the active layer surrounding the quantum well being somewhat more heavily alloyed with magnesium, and the electron blocker layer being the most heavily alloyed layer with magnesium.

11. The wide bandgap semiconductor light emitter of claim 10 wherein the p-type layer comprises a nitride layer.

12. The wide bandgap semiconductor light emitter of claim 1 wherein the electron blocker layer is approximately 100 to 200 Angstroms thick.

13. The wide bandgap semiconductor light emitter of claim 1 wherein the active layer is zinc sulfide made an n-type semiconductor by the presence of aluminum.

14. The wide bandgap semiconductor light emitter of claim 1 wherein the active layer is zinc sulfide made an n-type semiconductor by the presence of chlorine.

15. The wide bandgap semiconductor light emitter of claim 1 wherein the active layer is a zinc sulfide and the electron blocker layer is a magnesium zinc sulfide.

16. The wide bandgap semiconductor light emitter of claim 1 wherein the active layer is a magnesium zinc sulfide and the electron blocker layer is a magnesium sulfide.

17. The wide bandgap semiconductor light emitter of claim 1 wherein the active layer is zinc sulfide and the electron blocker layer is manganese zinc sulfide.

18. The wide bandgap semiconductor light emitter of claim 1 wherein the active layer and the electron blocker layer are layers wherein the value of x for the active layer is significantly less than the value of x for the electron blocker layer.

19. The wide bandgap semiconductor light emitter of claim 1 wherein the active layer is zinc cadmium sulfide and the electron blocker layer is zinc sulfide.

20. The wide bandgap semiconductor light emitter of claim 1 wherein the active layer is zinc cadmium sulfide and the electron blocker layer is magnesium zinc sulfide, whereby an approximate lattice match is obtained.

21. The wide bandgap semiconductor light emitter of claim 1 wherein the electron blocker layer is an intrinsic semiconductor layer.

22. The wide bandgap semiconductor light emitter of claim 1 wherein the electron blocker layer is an n-type semiconductor layer.

23. The wide bandgap semiconductor light emitter of claim 1 wherein the active layer is comprised of zinc oxide.

24. The wide bandgap semiconductor light emitter of claim 1 wherein the heterojunction is a type-II heterojunction.

25. A wide bandgap semiconductor light emitter comprising:
   a two terminal device having:
   a p-type gallium nitride layer having conduction and valence band energies;
   an electron blocker layer deposited on the p-type gallium nitride layer to form a heterojunction and having conduction and valence band energies;
   an n-type active layer deposited on the electron blocker layer and having conduction and valence band energies;
   the valence band energy of the active layer being at least approximately equal to the valence band energy of the p-type gallium nitride layer;
   the conduction band energy of the electron blocker layer being greater than the conduction band energy of the active layer;

the electron blocker layer having a thickness adequate to prevent significant electron tunneling through the electron blocker layer;

the active layer and the electron blocker layer each being selected from the group consisting of a specific material and an alloy of the specific material;

the wide bandgap semiconductor light emitter emitting light by the application of a forward bias voltage between the p-type layer and the active layer causing the injection of holes from the p-type layer into the active layer.

26. The wide bandgap semiconductor light emitter of claim 25 wherein the active layer and the electron blocker layer are alloys of the same elements, but with differing alloying ratios.

27. The wide bandgap semiconductor light emitter of claim 25 wherein the active layer is an alloy of the electron blocker layer.

28. The wide bandgap semiconductor light emitter of claim 25 wherein the electron blocker layer is an alloy of the active layer.

29. The wide bandgap semiconductor light emitter of claim 25 wherein the active layer is a sulfide layer.

30. The wide bandgap semiconductor light emitter of claim 25 wherein the active layer is a selenide.

31. The wide bandgap semiconductor light emitter of claim 25 wherein the active layer includes a quantum well.

32. The wide bandgap semiconductor light emitter of claim 31 wherein the quantum well is formed by the presence of cadmium within a part of the active layer.

33. The wide bandgap semiconductor light emitter of claim 31 wherein the electron blocker, the active layer and the quantum well all consist of magnesium zinc sulfide layers $Mg_xZn_{1-x}S$, the quantum well being the layer most lightly alloyed with magnesium, the layers surrounding the quantum well being somewhat more heavily alloyed with magnesium, and the electron blocker layer being the most heavily alloyed layer with magnesium.

34. The wide bandgap semiconductor light emitter of claim 25 wherein the electron blocker layer is approximately 100 to 200 Angstroms thick.

35. The wide bandgap semiconductor light emitter of claim 25 wherein the active layer is zinc sulfide made an n-type semiconductor by the presence of aluminum.

36. The wide bandgap semiconductor light emitter of claim 25 wherein the active layer is zinc sulfide made an n-type semiconductor by the presence of chlorine.

37. The wide bandgap semiconductor light emitter of claim 25 wherein the active layer is zinc sulfide and the electron blocker layer is manganese zinc sulfide.

38. The wide bandgap semiconductor light emitter of claim 25 wherein the active layer is zinc cadmium sulfide and the electron blocker layer is zinc sulfide.

39. The wide bandgap semiconductor light emitter of claim 25 wherein the active layer is zinc cadmium sulfide and the electron blocker layer is magnesium zinc sulfide, whereby an approximate lattice match is obtained.

40. The wide bandgap semiconductor light emitter of claim 25 wherein the electron blocker layer is an intrinsic semiconductor layer.

41. The wide bandgap semiconductor light emitter of claim 25 wherein the electron blocker layer is an n-type semiconductor layer.

42. The wide bandgap semiconductor light emitter of claim 25 wherein the active layer is comprised of zinc oxide.

43. The wide bandgap semiconductor light emitter of claim 25 wherein the layers consist of compounds formed by more ionic bonding than covalent bonding.

44. The wide bandgap semiconductor light emitter of claim 25 wherein the heterojunction is a type-II heterojunction.

45. A wide bandgap semiconductor light emitter comprising:

a two terminal device having:

a p-type gallium nitride layer having conduction and valence band energies;

a magnesium zinc sulfide electron blocker layer deposited on the p-type gallium nitride layer to form a heterojunction and having conduction and valence band energies;

an n-type zinc sulfide active layer deposited on the electron blocker layer and having conduction and valence band energies;

the valence band energy of the active layer being at least approximately equal to or greater than the valence band energy of the p-type gallium nitride layer;

the conduction band energy of the electron blocker layer being greater than the conduction band energy of the active layer;

the electron blocker layer having a thickness adequate to prevent significant electron tunneling through the electron blocker layer.

46. The wide bandgap semiconductor light emitter of claim 45 wherein the active layer includes a quantum well.

47. The wide bandgap semiconductor light emitter of claim 46 wherein the quantum well is formed by the presence of cadmium in the active layer.

48. A multicolor semiconductor light emitter comprising:

a p-type layer having conduction and valence band energies;

an electron blocker layer deposited on the p-type layer to form a heterojunction and having conduction and valence band energies;

an n-type active layer deposited on the electron blocker layer and having conduction and valence band energies;

the conduction band energy of the active layer being greater than the conduction band energy of the p-type layer;

the valence band energy of the active layer being at least approximately equal to or greater than the valence band energy of the p-type layer;

the conduction band energy of the electron blocker layer being greater than the conduction band energy of the active layer;

the electron blocker layer having a thickness adequate to prevent significant electron tunneling through the electron blocker layer;

the active layer and the electron blocker layer each being selected from the group consisting of a specific material and an alloy of the specific material;

the wide bandgap semiconductor light emitter emitting light by the application of a forward bias voltage between the p-type layer and the active layer causing the injection of holes from the p-type layer into the active layer; and the active layer being subdivided into areas of different composition to control the color emitted thereby.

49. The multicolor semiconductor light emitter of claim 48 wherein the areas of different composition comprise layers containing different dopants.

50. The multicolor semiconductor light emitter of claim 48 wherein the active layer is comprised of zinc sulfide and the areas of different composition comprise zinc sulfide regions containing different dopants.

51. The multicolor semiconductor light emitter of claim 48 wherein the areas of different composition comprise layers containing different alloying ratios.

52. The multicolor semiconductor light emitter of claim 48 wherein the active layer is comprised of zinc sulfide and the areas of different composition comprise zinc sulfide regions containing cadmium in differing alloying ratios.

53. A wide bandgap semiconductor light emitter comprising:

a two terminal device having:

a p-type layer having conduction and valence band energies;

an electron blocker layer deposited on the p-type layer to form a heterojunction and having conduction and valence band energies; and, an n-type active layer deposited on the electron blocker layer and having conduction and valence band energies;

the valence band energy of the p-type layer being lower than 0.3 ev above the valence band energy of the active layer;

the conduction band energy of the electron blocker layer being greater than the conduction band energy of the active layer;

the electron blocker layer having a thickness adequate to prevent significant electron tunneling through the electron blocker layer;

the active layer and the electron blocker layer each being of the same material or an alloy thereof.

54. A wide bandgap semiconductor light emitter comprising:

a two terminal device having:

a p-type layer having conduction and valence band energies;

an electron blocker layer deposited on the p-type layer to form a heterojunction and having conduction and valence band energies; and, an n-type active layer deposited on the electron blocker layer and having conduction and valence band energies;

the valence band energy of the p-type layer being lower than 0.2 ev above the valence band energy of the active layer;

the conduction band energy of the electron blocker layer being greater than the conduction band energy of the active layer;

the electron blocker layer having a thickness adequate to prevent significant electron tunneling through the electron blocker layer;

the active layer and the electron blocker layer each being of the same material or an alloy thereof.

55. A wide bandgap semiconductor light emitter comprising:

a two terminal device having:

a p-type gallium nitride layer having conduction and valence band energies;

an electron blocker layer deposited on the p-type gallium nitride layer to form a heterojunction and having conduction and valence band energies;

an n-type active layer deposited on the electron blocker layer and having conduction and valence band energies;

the valence band energy of the p-type gallium nitride layer being lower than 0.2 ev above the valence band energy of the active layer;

the conduction band energy of the electron blocker layer being greater than the conduction band energy of the active layer;

the electron blocker layer having a thickness adequate to prevent significant electron tunneling through the electron blocker layer;

the active layer and the electron blocker layer each being selected from the group consisting of a specific material and an alloy of the specific material;

the wide bandgap semiconductor light emitter emitting light by the application of a forward bias voltage between the p-type layer and the active layer causing the injection of holes from the p-type layer into the active layer.

56. A wide bandgap semiconductor light emitter comprising:

a two terminal device having:

a p-type gallium nitride layer having conduction and valence band energies;

an electron blocker layer deposited on the p-type gallium nitride layer to form a heterojunction and having conduction and valence band energies;

an n-type active layer deposited on the electron blocker layer and having conduction and valence band energies;

the valence band energy of the p-type gallium nitride layer being lower than 0.3 ev above the valence band energy of the active layer;

the conduction band energy of the electron blocker layer being greater than the conduction band energy of the active layer;

the electron blocker layer having a thickness adequate to prevent significant electron tunneling through the electron blocker layer;

the active layer and the electron blocker layer each being selected from the group consisting of a specific material and an alloy of the specific material;

the wide bandgap semiconductor light emitter emitting light by the application of a forward bias voltage between the p-type layer and the active layer causing the injection of holes from the p-type layer into the active layer.

* * * * *